United States Patent [19]
Hshieh et al.

[11] Patent Number: 5,844,277
[45] Date of Patent: Dec. 1, 1998

[54] POWER MOSFETS AND CELL TOPOLOGY

[75] Inventors: Fwu-Iuan Hshieh, Saratoga; True-Lon Lin, Cupertino, both of Calif.

[73] Assignee: MagePower Semiconductor Corp., San Jose, Calif.

[21] Appl. No.: 603,724

[22] Filed: Feb. 20, 1996

[51] Int. Cl.⁶ .......................... H01L 29/76; H01L 29/94; H01L 31/062

[52] U.S. Cl. .......................... 257/341; 257/401; 257/342

[58] Field of Search .................... 257/139, 341, 257/401, 147, 153, 342

[56] References Cited

U.S. PATENT DOCUMENTS

| | | | |
|---|---|---|---|
| 5,016,066 | 5/1991 | Takahashi | 257/341 |
| 5,136,349 | 8/1992 | Yilmaz et al. | 257/341 |
| 5,151,762 | 9/1992 | Uenishi et al. | 257/401 |
| 5,321,295 | 6/1994 | Hisamoto | 257/341 |
| 5,408,118 | 4/1995 | Yamamoto | 257/341 |

*Primary Examiner*—Wael Fahmy
*Attorney, Agent, or Firm*—Bo-In Lin

[57] ABSTRACT

A MOSFET device formed in a semiconductor chip with a top surface and a bottom surface. The MOSFET device includes a drain region doped with impurities of a first conductivity type, formed near the bottom surface. The MOSFET device further includes a plurality of vertical cells wherein each of the vertical cell includes a vertical pn-junction zone region includes a lower-outer body region, doped with impurities of a second conductivity type, formed on top of the drain region. The pn-junction region further includes a source region, doped with impurities of the first conductivity type, formed on top of the lower-outer body region, the lower-outer body region surrounding the source region and extending to the top surface thus defining a cell area for the cell. The vertical cell further includes a source contact formed on the top surface contacting the source region. The MOSFET further includes a plurality of gates. Each gate is formed on the top surface as a poly layer extending from an area near a boundary of the source region and the lower-outer body region of one of the cells to a neighboring cell, the gate includes a thin insulative bottom layer for insulating from the vertical cell, the gate is provided for applying a voltage thereon for controlling a charge state of a channel underneath each of the gates thus controlling a vertical current from the source contact to the drain region. The MOSFET device further includes a plurality of open stripes whereby a width of the channel is increased and a JFET resistance for each of the vertical cells is decreased.

1 Claim, 16 Drawing Sheets

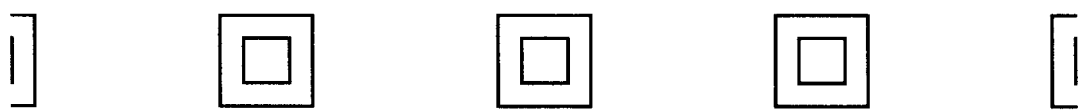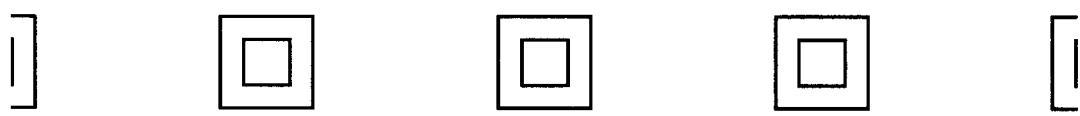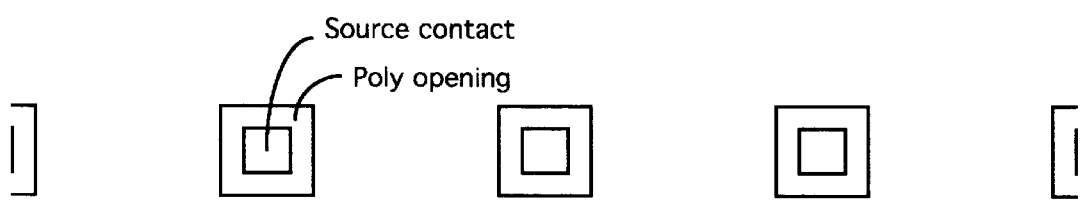
FIG. 2C
(Prior Art)

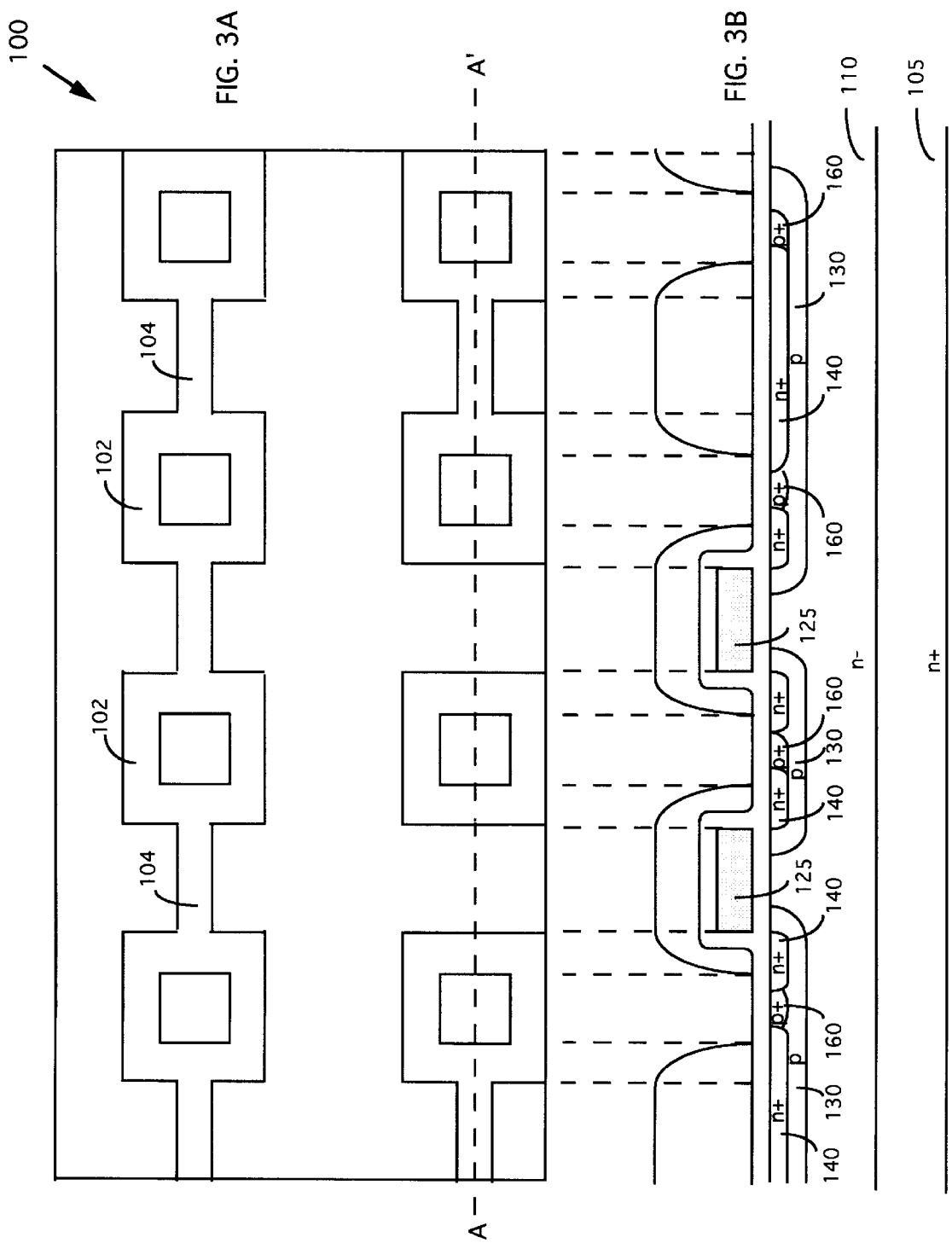

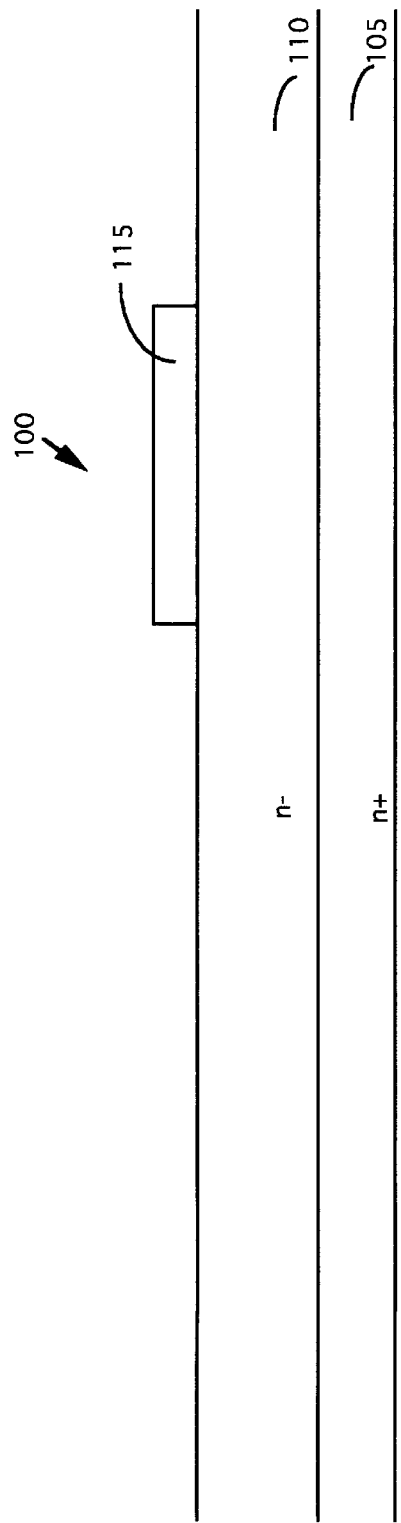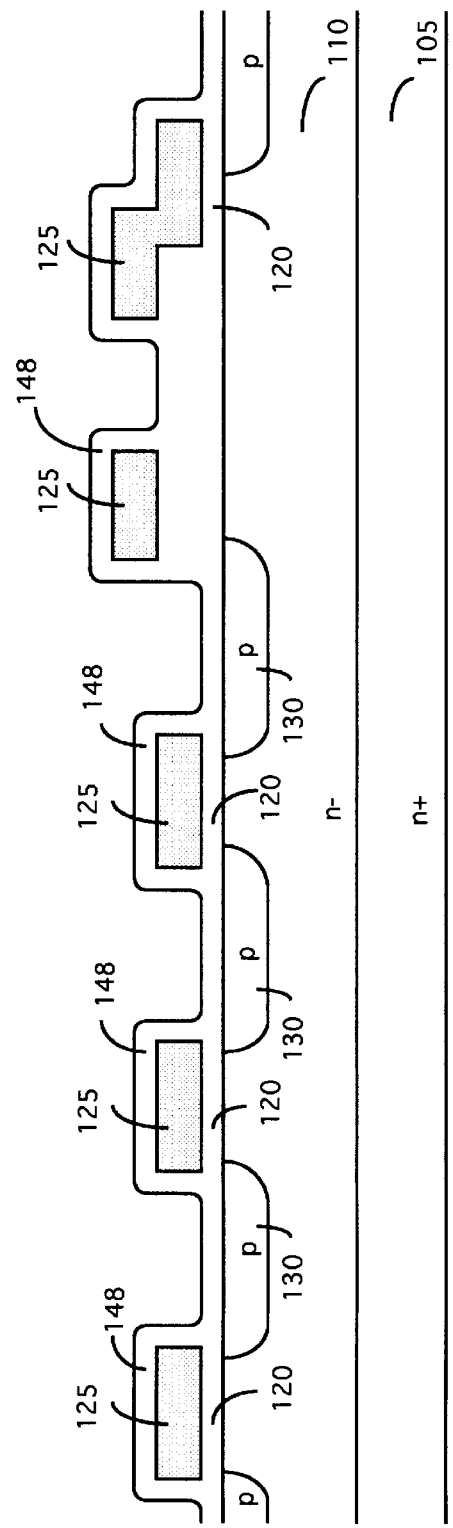

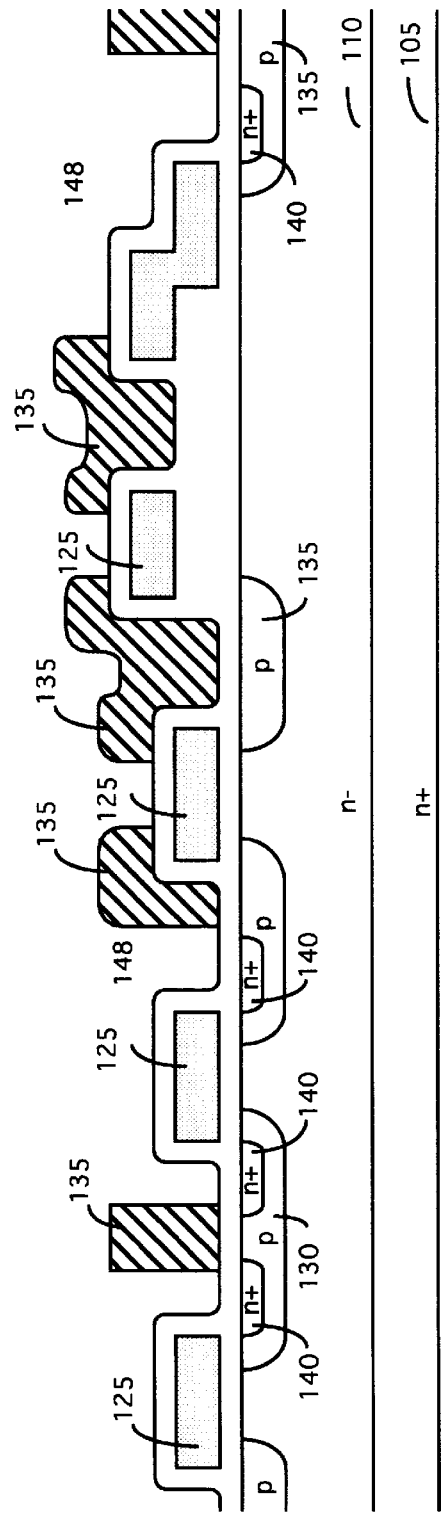
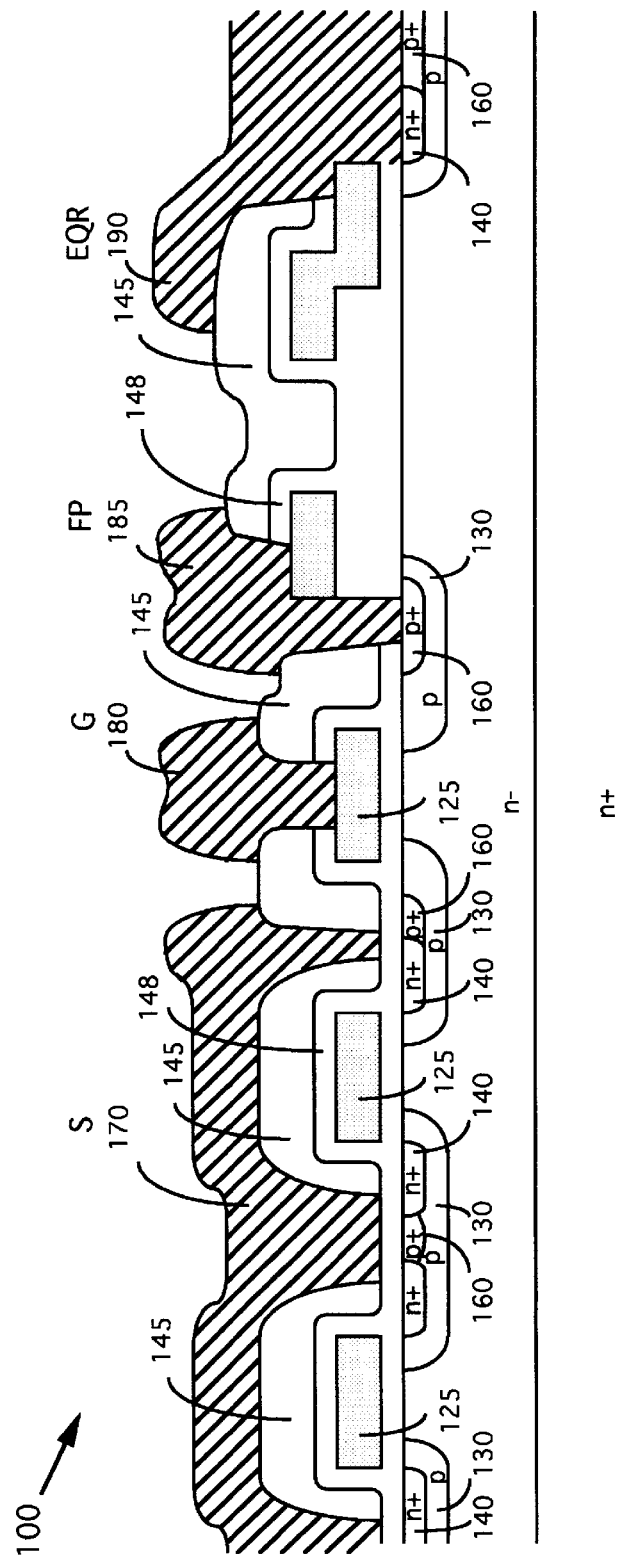
FIG. 4C
FIG. 4D

POWER MOSFETS AND CELL TOPOLOGY

BACKGROUND OF THE INVENTION

1. Field of the Invention

This invention relates generally to the structure and fabrication process of planar power MOSFETs. More particularly, this invention relates to a novel and improved structure and process for fabricating a power MOSFET device to achieve lower on-resistance, prevention of corner breakdown and simplified fabrication process for manufacturing MOSFET devices at a lower cost.

2. Description of the Prior Art

Conventional structure and processing steps for fabricating a power metal oxide silicon field effect transistor (MOSFET) power device are limited by several technical difficulties. Specifically, conventional planar cellular structure of power MOSFETs, such as square, circular, and hexagonal topologies are limited by the difficulty that the on-resistance is decreased when the poly space is reduced to achieve higher cell density by shrinking unit cell areas. However, a planar DMOS is limited by the surface area occupied by the polysilicon gate electrode. Additional reduction in the size of the gate electrode exacerbate the parasitic JFET pinching effect, leading to higher device on-resistance at a small cell pitch. Conversely, if the poly gate dimension is held constant to avoid the pinching effect, and the size of the source/body region, i.e., the opening in the poly, is reduced instead, the specific on-resistance still increases at high cell densities. This is caused by the transistor gate width per unit area decreases. With such electrical and geometric restrictions, the cell density is limited to 6.5 million cells/inch$^2$. For a person of ordinary skill in the art, further increases in planar DMOS cell density is unwarranted and likely to be detrimental to performance. The pinching effect caused by cell pitch reduction has to be eliminated to significantly benefit power MOSFET specific on-resistance. Additionally, the JFET resistance can be reduced with a shallower body junction. However, the breakdown voltage of the device is degraded with shallower body junctions. The tradeoffs of these performance characteristics become designer's dilemmas which cannot be easily resolved with the conventional planar structures.

In order to better understand the difficulties encountered in the prior art, general descriptions for the techniques currently employed for fabricating power MOSFET devices are first discussed. FIG. 1 shows a typical vertical double diffused MOS (VDMOS) device which uses a double diffusion technique to control the channel length l. Two successive diffusions are performed with first a p diffusion using boron, then a n diffusion using either arsenic or phosphorus, to produce two closely spaced pn junctions at different depths below the silicon surface. With this pn-junction, as shown in FIG. 1, the VDMOS supports the drain voltage vertically in the n$^-$ epilayer. The current flows laterally from the source through the channel, parallel to the surface of the silicon. The current flow then turns through a right angle to flow vertically down through the drain epilayer to the substrate and to the drain contact. The p-type "body" region in which the channel is formed when a sufficient positive voltage is applied, and the n$^+$ source contact regions are diffused successively through the same window etched in the oxide layer. The channel length can be controlled through the processing steps. Because of the relative doping concentrations in the diffused p-channel region and the n– layer, the depletion layer which supports $BV_{ds}$, a drain to source voltage, extends down into the epilayer rather than laterally into the channel.

In order to best utilize the silicon, the power MOSFET device is fabricated by employing a cellular structure as that shown in FIGS. 2A and 2B. Several different schemes are used. High current capability is obtained by connecting many cells together in parallel as will be discussed below. As shown in FIG. 2B, heavily doped poly-crystalline silicon is used as gate electrode. For power MOSFETs, it has several advantages because it simplifies the connection metalization process where an oxide layer can be formed over the poly-silicon and the source metalization may then be extended over the whole of the upper surface. The poly silicon, used as gate electrodes, can be deposited with great accuracy and the gate oxide is more stable and less prone to contamination than the aluminum gate. Furthermore, the source is self aligned automatically with the gate edge thus greatly simplifies the fabrication process. FIGS. 2C and 2D shows the top views of two alternate square cell arrangements wherein the central dark squares represent the poly gate and the outer squares represent the area occupied by the source region of each cell. The cell arrangement in FIG. 2C is commonly referred to as a "square on square" cell topology while that shown in FIG. 2D is a "square on hexagon" cell topology.

Lidow et al. disclose in U.S. Pat. No. 4,593,302 (issued on Jun. 3, 1986) entitled "Process for Manufacture of High Power MESFET with Laterally Distributed High Carrier Density Beneath the Gate Oxide", a high power MESFET structure consists of a plurality of source cells distributed over the upper surface of a semiconductor chip with a drain electrode on the bottom of the chip. Each of the source cells is hexagonal in configuration and is surrounded by a narrow, hexagonal conduction region disposed beneath a gate oxide. The semiconductor material beneath the gate oxide has a relatively high conductivity, with the carriers being laterally and equally distributed in density beneath the gate oxide. The high conductivity hexagonal channel is formed in a low conductivity epitaxially formed region and consists of carriers deposited on the epitaxial region prior to the formation of the source region. Symmetrically arranged gate fingers extend over the upper surface of the device and extend through and along slits in the upper source metalizing and are connected to a polysilicon gate grid which overlies the gate oxide.

Lidow et al. disclose a MOSFET structure where blank N$^+$ implantation is performed prior to poly gate deposition for the purpose of reducing the JFET resistance. This manufacture process may be feasible for longer channel length. However, when the cells are shrunk and the channel length is decreased to submicron range, this technique may likely lead to punch-through between drain and source due to the reduction in doping concentration of the channel region but also in channel width when the technique disclosed by Lidow et al. is applied.

Therefore, there is still a need in the art of power device fabrication, particularly for power MOSFET design and fabrication, to provide a structure and fabrication process that would resolve these limitations.

SUMMARY OF THE PRESENT INVENTION

It is therefore an object of the present invention to provide an improved MOSFET structure, topology, and fabrication process to overcome the aforementioned difficulties encountered in the prior art.

Specifically, it is an object of the present invention to provide an improved MOSFET structure and fabrication process wherein novel cell topology is arranged to increase the channel width thus maintain a reasonable low on-resistance even when the cell density is increased beyond the current limit 6.5 million cells/inch² and the dimension of the MOSFET cell is further reduced.

Another object of the present invention is to provide an improved MOSFET structure and fabrication process where the poly gate above the drain region is patterned and selectively implanted with the same type of dopant as the drain region to reduce the on-resistance and the JFET effect.

Another object of the present invention is to provide an improved MOSFET structure and fabrication process wherein the critical dimensions of the MOSFET cells are made equivalent by taking advantage of modern technology of more precisely controllable lithographic processes without requiring to make a broader poly gate such that the breakdown voltage at the poly gate runner can be prevented.

Another object of the present invention is to provide an improved MOSFET structure and fabrication process wherein a corner blocking technique is applied for applying a N+ photo resist at the four corners of each core cell for improving the manufacturing capability of a power MOSFET device.

Briefly, in a preferred embodiment, the present invention includes a MOSFET device formed in a semiconductor chip with a top surface and a bottom surface. The MOSFET device includes a drain region, doped with impurities of a first conductivity type, formed near the bottom surface. The MOSFET device further includes a plurality of vertical cells wherein each of the vertical cell includes a vertical pn-junction zone region includes a lower-outer body region, doped with impurities of a second conductivity type, formed on top of the drain region. The pn-junction region further includes a source region, doped with impurities of the first conductivity type, formed on top of the lower-outer body region, the lower-outer body region surrounding the source region and extending to the top surface thus defining a cell area for the cell. The vertical cell further includes a source contact formed on the top surface contacting the source region. The MOSFET device further includes a plurality of gates wherein each gate formed on top of the top surface as a poly layer extending from an area near a boundary of the source region and the lower-outer body region of one of the cells to a neighboring cell, the gate includes a thin insulative bottom layer for insulating from the vertical cell, the gate is provided for applying a voltage thereon for controlling a charge state of a channel underneath each of the gates thus controlling a vertical current from the source contact to the drain region. The MOSFET device further includes a plurality of open stripes opened by removing a stripes of the poly layer connecting two adjacent vertical cells whereby a width of the channel for conducting a source-to-drain current is increased and a junction field-effect-transistor (JFET) resistance for each of the vertical cells is decreased.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 2C to 2D are top views of the prior art cell arrangements of the square MOSFET of FIG. 2B;

FIGS. 3A and 3B show a top view and a cross sectional view of a MOSFET cell topology and structure of the present invention;

FIGS. 4A to 4D show the processing steps for manufacturing the MOSFET device of FIG. 3;

DETAILED DESCRIPTION OF THE PREFERRED EMBODIMENT

Figure 1:
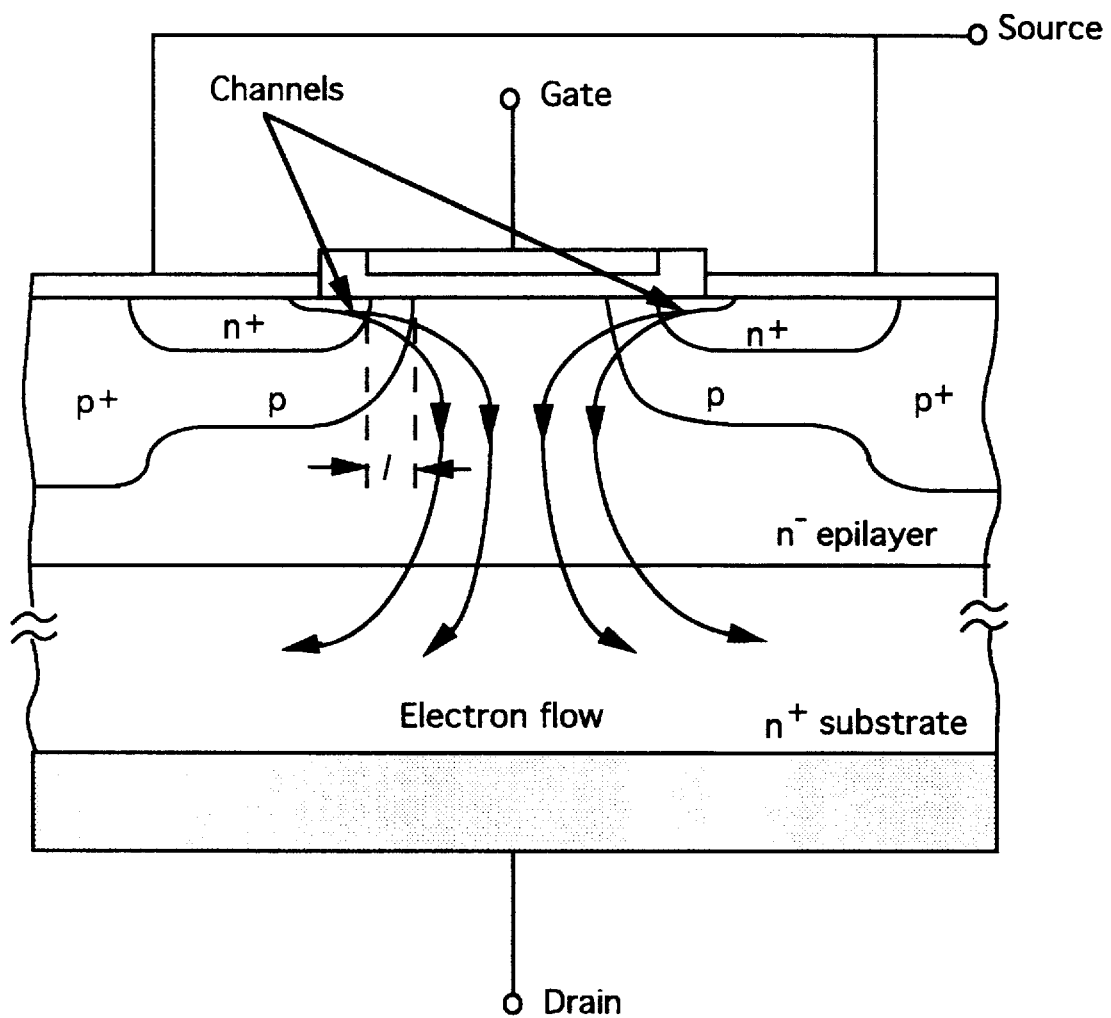
FIG. 1 is a cross-sectional view of a prior art structure of a general MOSFET.
Figure 2A:
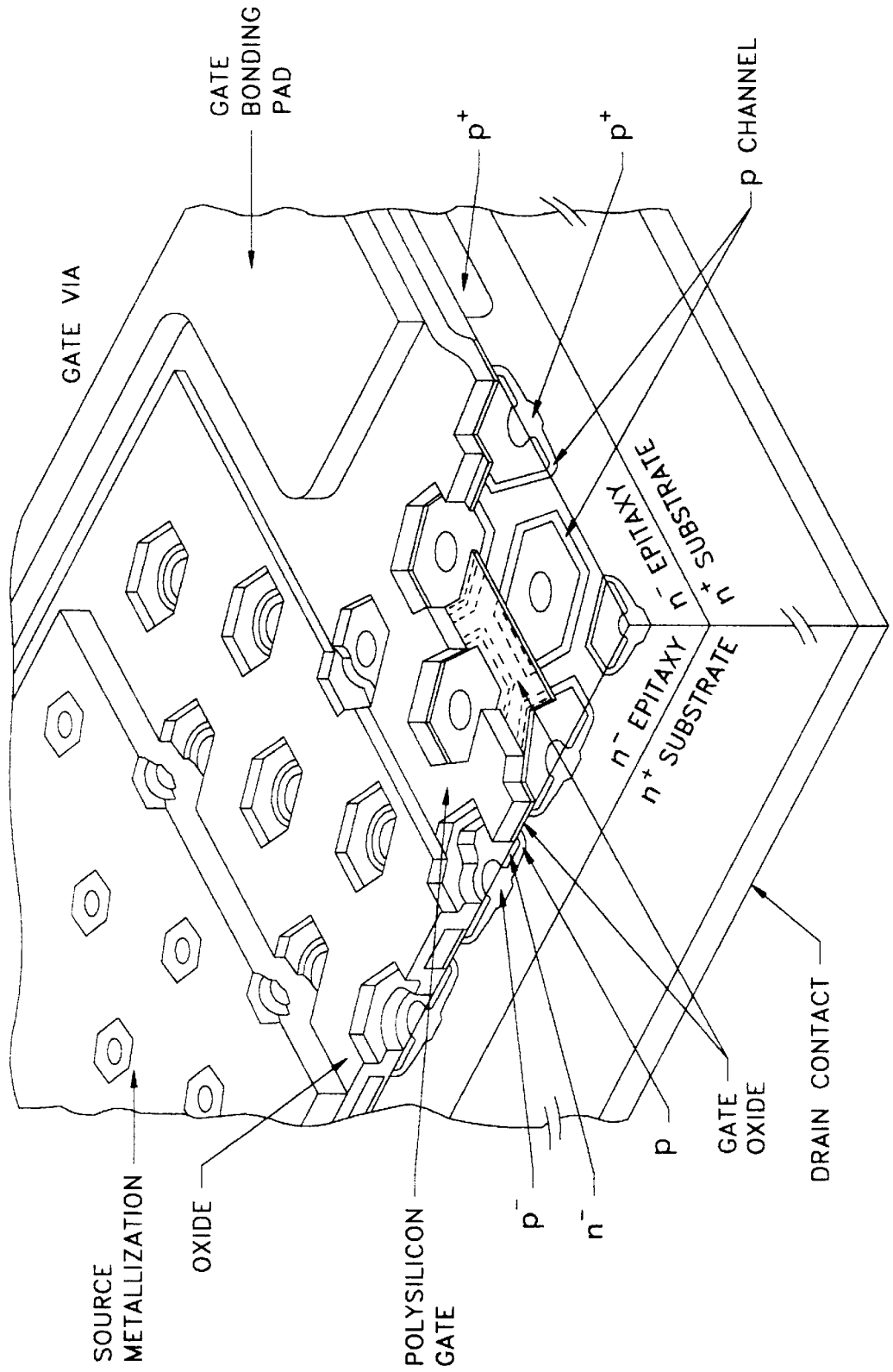
FIGS. 2A to 2B are partial perspective views of the layer structure of a prior art hexagonal and square MOSFET respectively.
Figure 2B:
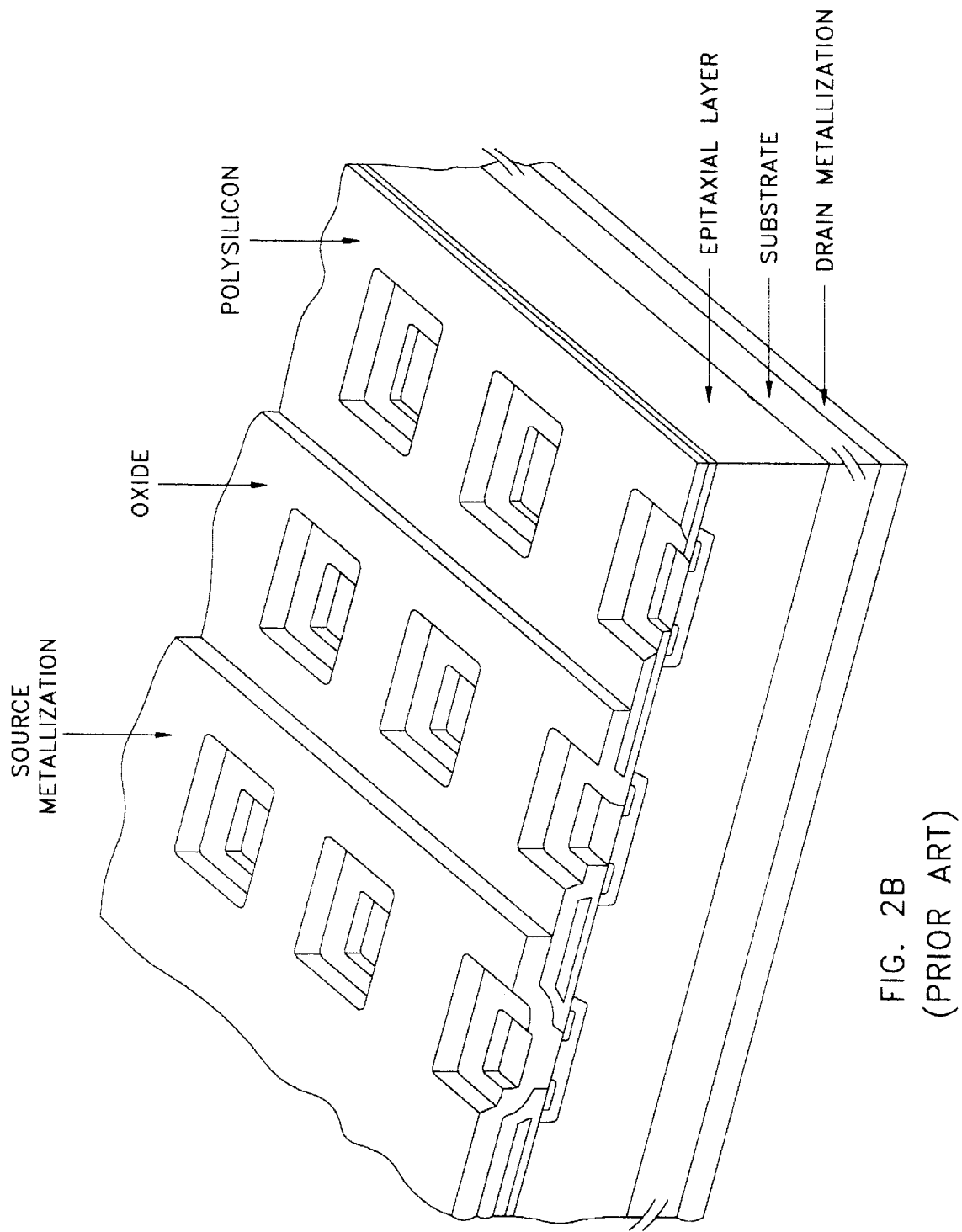
Figure 2D:
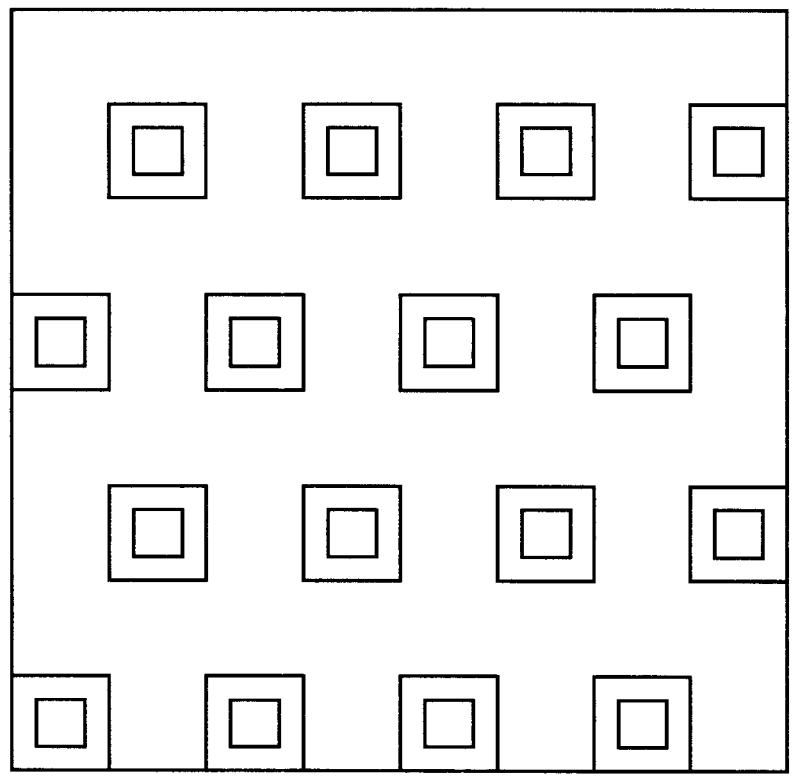

Referring to FIG. 3A for a top view and cross sectional views respectively of a power MOSFET device 100 with novel topology of the gate arrangement. The unit cells 102 as shown are 'square on square' configuration where the square cells 102 are connected by open stripes 104 in the polycrystalline silicon layer. A cross sectional view of the MOSFET 100 along the line A–A' is shown in FIG. 3B. The structural differences between core cells 102 which are connected with open strips 104 with a portion of the poly layer between these cells removed compared with regular core cells 102 are illustrated in FIG. 3B. The details of the structure with the fabrication processes are further described below in FIGS. 4A to 4D. With this novel type of open-stripe between poly gate arrangement, no matter the unit cells are square, circular, hexagonal, etc., an improvement of channel resistance of approximately 25% is achieved. The improvement of the channel resistance is accomplished through the increase of channel width W. The on-resistance $R_{on}$ of the power MOSFET devices 100 is inversely proportion to the channel width W and proportional to the channel length L.

$$R_{on} = k_1(L/W) + k_2 \qquad (1)$$

where $k_1$ and $k_2$ are a constant. By connecting the unit cells 102 with open stripes 104 in the poly layer, the poly open periphery is increased which in turn increases the channel width W. A lower $R_{on}$ is obtained because the width W is increased through the use of the open poly stripes 104.

Please refer to FIGS. 4A to 4D for the processing steps in manufacturing the MOSFET device 100 as describe above. As shown in FIG. 4A, the processing steps begins by first growing a N⁻ epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epi-layer 110 is about six to eight microns. An initial oxide layer 115 of thickness in the range of 5,000 to 10,000 Å is grown which is then etched by applying a mask to define the active areas. In FIG. 4B, a gate oxidation process is first carried out to form a gate oxide layer 120. A polysilicon layer 125 is then deposited on the gate oxide layer 120. A POCL$_3$ doping process is carried out followed by an arsenic (As) implant process with an ion beam of energy at 60–80 Kev with a flux density of 5 to $8 \times 10^{15}$/cm$^2$. A poly mask is then applied to carry out the an anisotropic etching process to define the poly gate 125 wherein the poly gate 125 are formed with open strips 104 as that shown in FIGS. 3A and 3B with a portion of the poly layer 120 removed between adjacent core cells 102. The resist is then stripped and a p-body implant at 30–100 Kev with an ion beam of $3 \times 10^{13}$ to $3 \times 10^{14}$/cm$^2$ flux density is applied to implant the p-body regions 130. A p-body diffusion process is then carried out at an elevated temperature of 1,000°–1, 200° C. for ten minutes to increase the depth of the p-body region 120 to 1.0–2.0 $\mu$. A silicide layer 148 is then formed covering the top surface.

Referring to FIG. 4C, a N+ block mask 135 is applied to carry out an N$^+$ implant to form the N$^+$ region 140. The N$^+$ implantation is carried out with an ion beam at an energy of 60–100 Kev and ion flux density of $5 \times 10^{15}$ to $1 \times 10^{16}$/cm$^2$. After the resist, i.e., the N$^+$ blocking mask 135, is stripped, the N$^+$ source regions 140 are driven into desired junction depth ranging from 0.2 to 1.0 $\mu$ by a diffusion process. Referring to FIG. 4D, a BPSG or PSG is deposited to form a layer 145 of approximately 5000–15,000 Å in thickness. A BPSG flow or PSG densification process is performed at 900°–950° C. for thirty minutes to one hour. A contact mask is applied to perform an etching process to define the contact windows. A p+ ion implantation is carried out to form the p+ region 160 by a p+ activation process at 900°–950° C. in an oxidation or inert gas ambient The final power MOSFET device 100 is completed with the metal deposition and metal etching with a metal mask to define the source contacts (S) 170, the gate contacts (G) 180, the field plate (FP) 185, and equal potential ring (EQR) 190. Since these metal contacts are well known in the art and are not the major features of this invention, they are not specifically described in details for the sake of simplicity and being more clearly focused on the main features of the invention.

Figure 5:
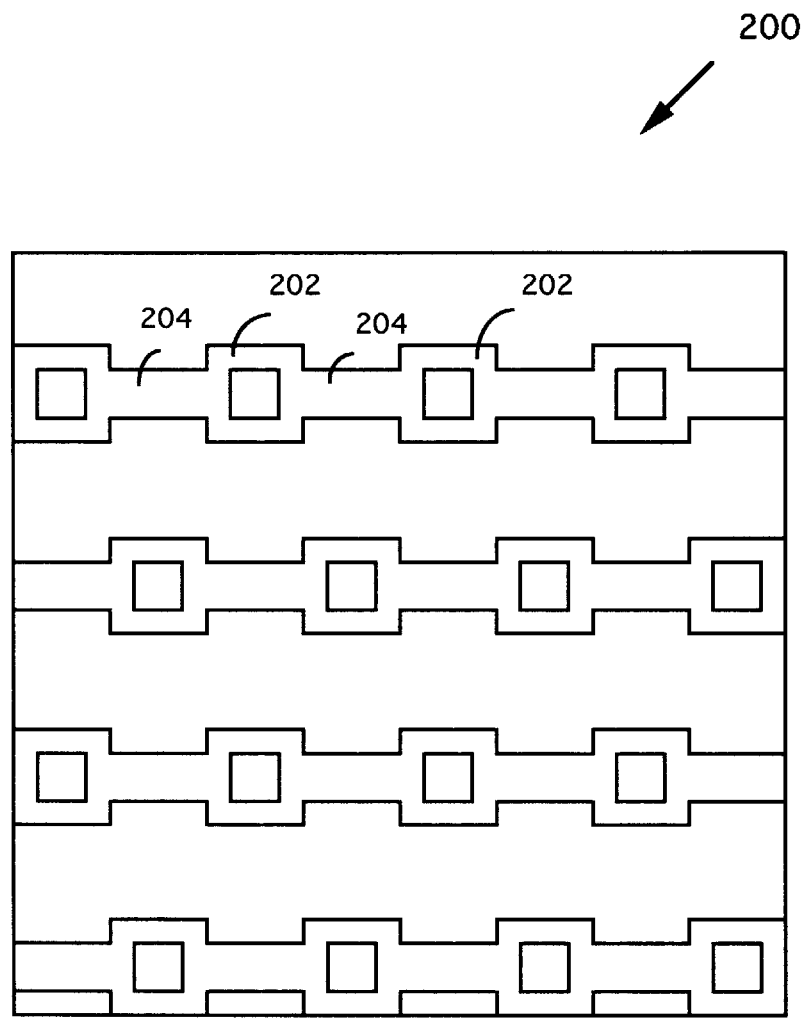
FIGS. 5 to 7 are top views of three alternate MOSFET cell topologies of the present invention.
Figure 6:
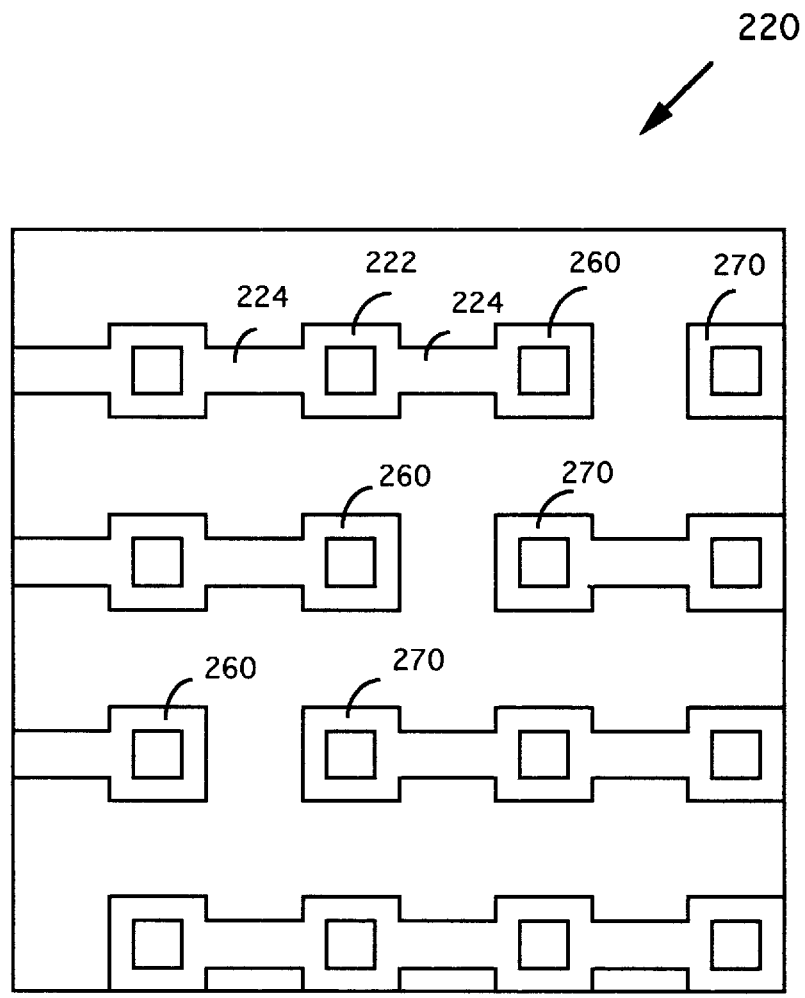
Figure 7:
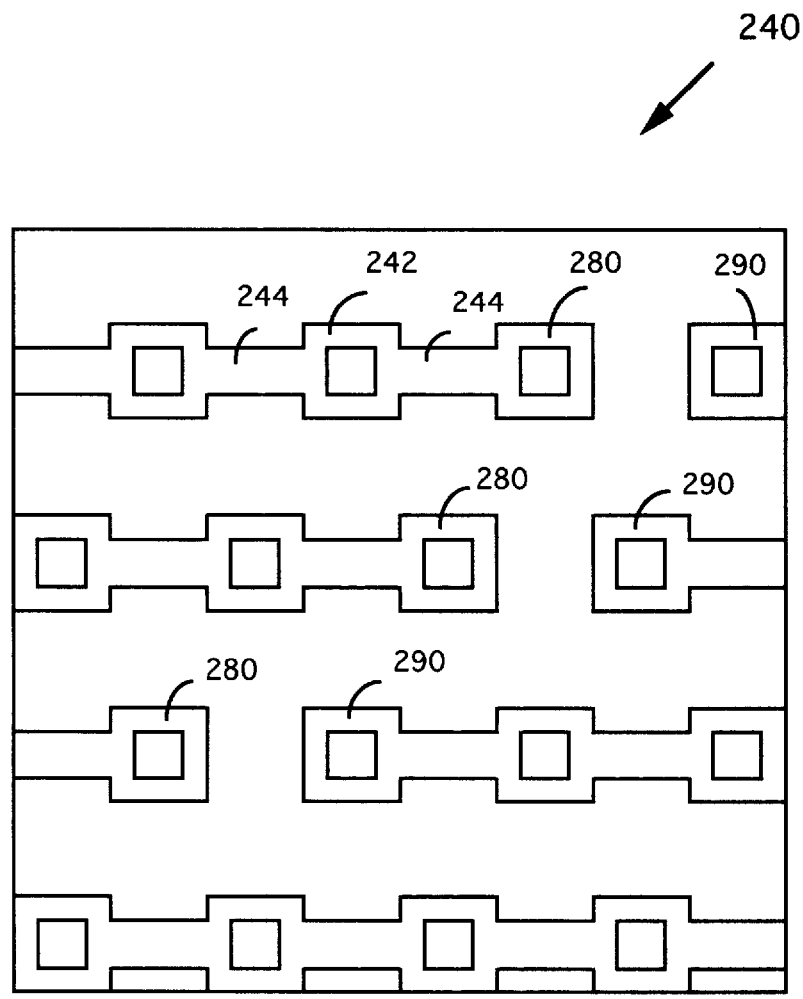

FIG. 5 shows another preferred embodiment where the power MOSFET device 200 has a slightly different configuration of gate arrangement where, again, the square cells 202 are configured as "squares-on-hexagon" arrangement which are connected by open stripes 204 with a portion of the poly layer between adjacent core cells 202 removed. The open strips 204 when arranged between adjacent unit cells 202 only in the horizontal direction as that shown, the device speed may be affected due to the fact that the open striped are only arranged in the horizontal and not in the vertical direction. For that reason, alternate preferred embodiments of the power MOSFET power devices 220 and 240 are shown in FIGS. 6 and 7 respectively where some unit cells, e.g., cells 260 and 270, and 280 and 290, are not connected with open stripes in order to improve the device speed. The cell topology can be flexibly arranged depending on the tradeoffs between the speed and the on-resistance for particular applications. The topology of the open stripes can be arranged by applying different types of poly gate masks. The partial top views of the poly gate masks are formed with shapes identical to the topologies as that shown in FIGS. 3, 4, 5, 6 and 7 except that the solid-black central squares representing the source contacts should be removed since they are not part of the poly masks for forming the open poly stripes described above.

Figure 9:
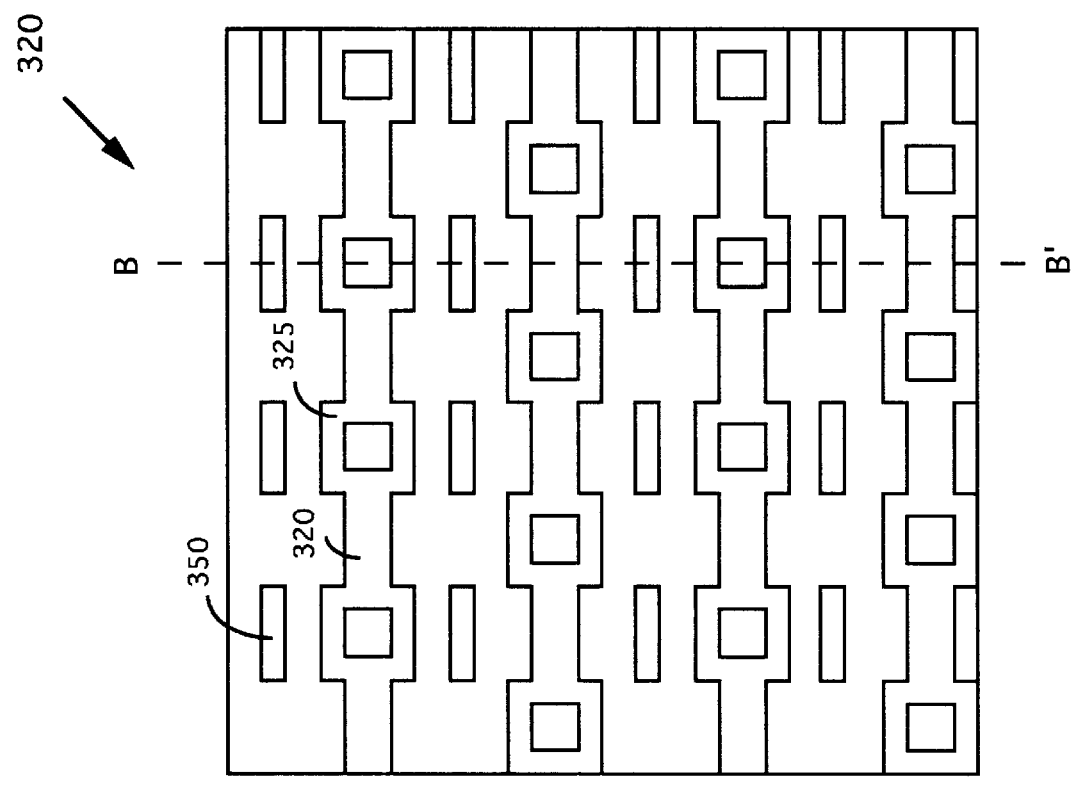
FIGS. 8 and 9 are top views of two alternate preferred embodiments with an opening in the poly-gate for selective JFET-resistance reduction implant.
Figure 8:
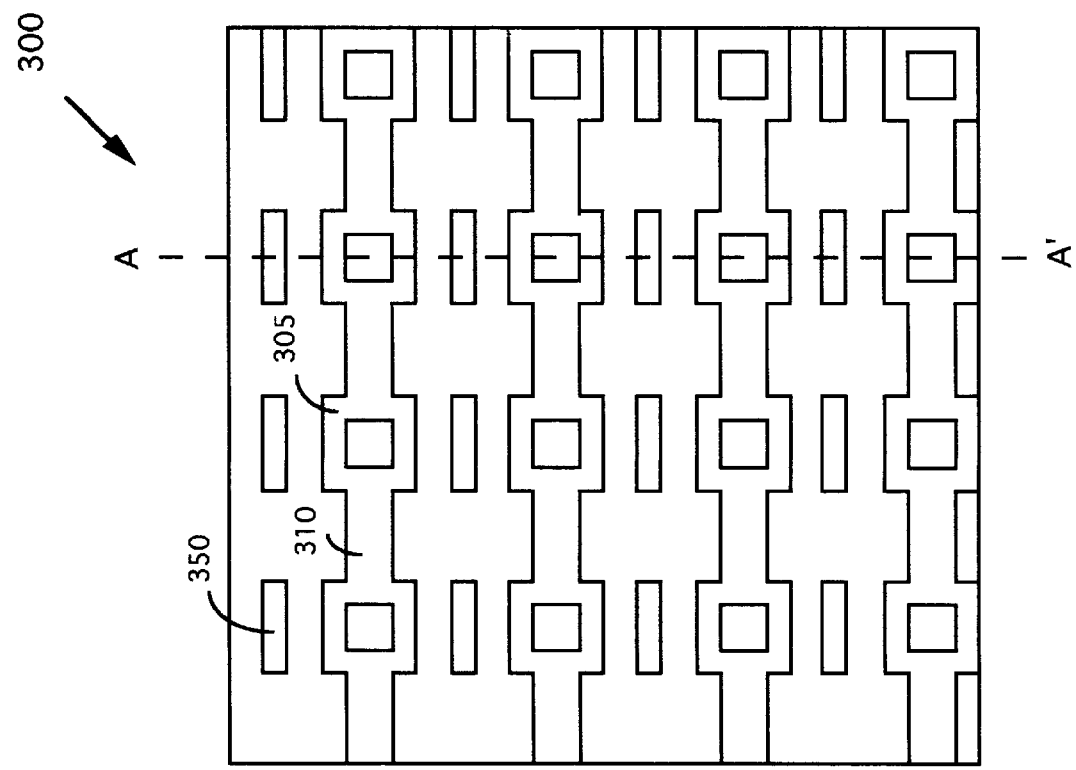
Figure 10:
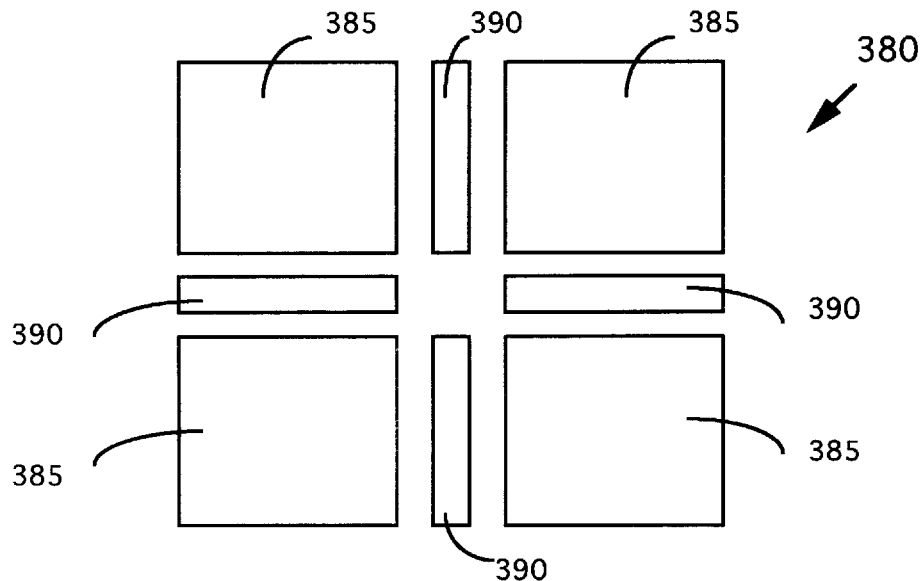
FIG. 10 shows another preferred embodiment of a MOSFET device with poly-gate openings for selective drain implantation.
Figure 11:
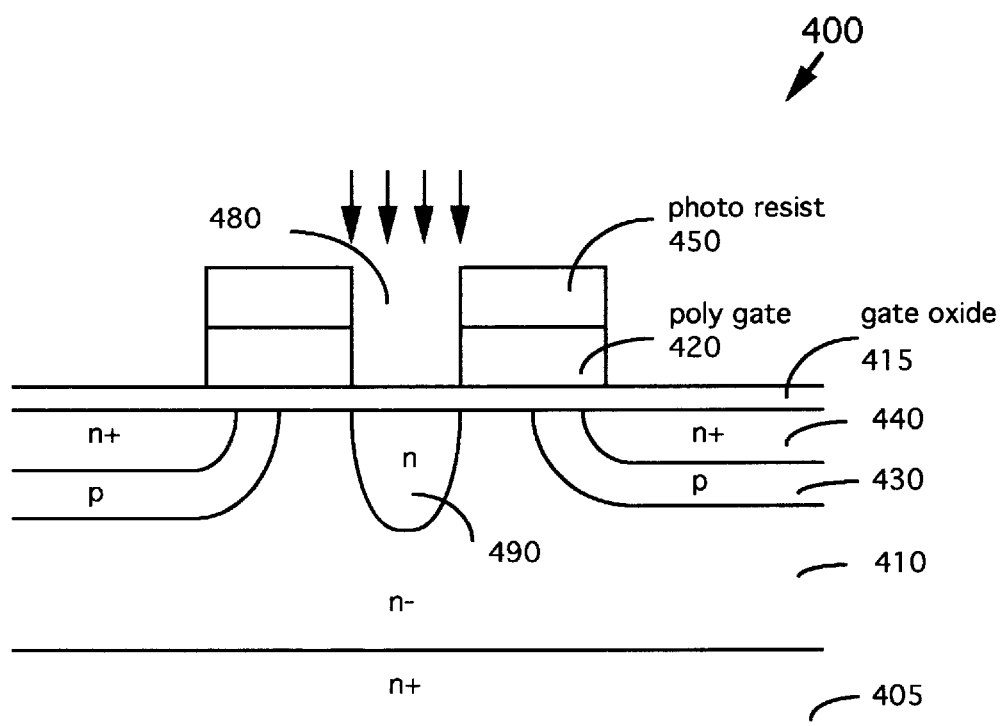
FIG. 11 shows the cross sectional view of the MOSFET devices of FIGS. 9 and 10.

Please refer to FIGS. 8, and 9 for the top views of alternate preferred embodiments of the present invention for MOS-FET devices 300 and 320 with square cells, i.e., cell 305, on square and square cells, i.e., cells 325, on hexagon cell topologies with open poly strips 310 and 320, respectively which include additional improvements that the poly gate has openings 350 for selective drain implantation as described below. FIG. 10 shows another preferred embodiment of MOSFET device 380 with poly-gate openings 390 for selective drain implantation for a close cell topology where the poly gate for each square cell 385 does not have open stripes connected with next cells. A cross-sectional view of the cell structure along A–A' of FIG. 9 and B–B' in FIG. 10, is shown in FIG. 11 as a MOSFET 400 wherein the structure features are similar to that shown in FIG. 1 except that the poly gate 420 has an opening 480 which is patterned specifically for implanting a special JFET-resistance reduction zone 490 in the drain region 410. This novel improvement is implemented with the poly gate 420 above the drain region 410 patterned and implanted with a same type of dopant as the drain region by applying a photo-resist 450. For a PMOS, a boron implant is performed through the central openings 480, while P, As, or Sb implantation are performed with a NMOS device. Instead of applying blank N$^+$ implantation prior to poly gate deposition as that taught by Lidow et al., selective N$^+$ implantation is applied to increase the drain doping concentration which has the same effect in reducing the JFET resistance. With this selectively implanted JFET-resistance reduction zone 490 in the drain region 410, the technical difficulty of generating a punch-through problem in Lidow's blank N$^+$ implantation is eliminated. This novel structure with a selective implanted zone for JFET-resistance reduction in the drain region 410 achieves a higher doping concentration for the epi-layer to reduce the JFET resistance without unduly introducing a punch through problem. By the use of this patterned implant technique, additional advantage is provided because now the gate has reduced area. As a consequence, the parasitic gate-drain capacitance generated from the overlapping of gate and drain is reduced which has an additional benefit that the speed of the device is increased.

Figure 12A:
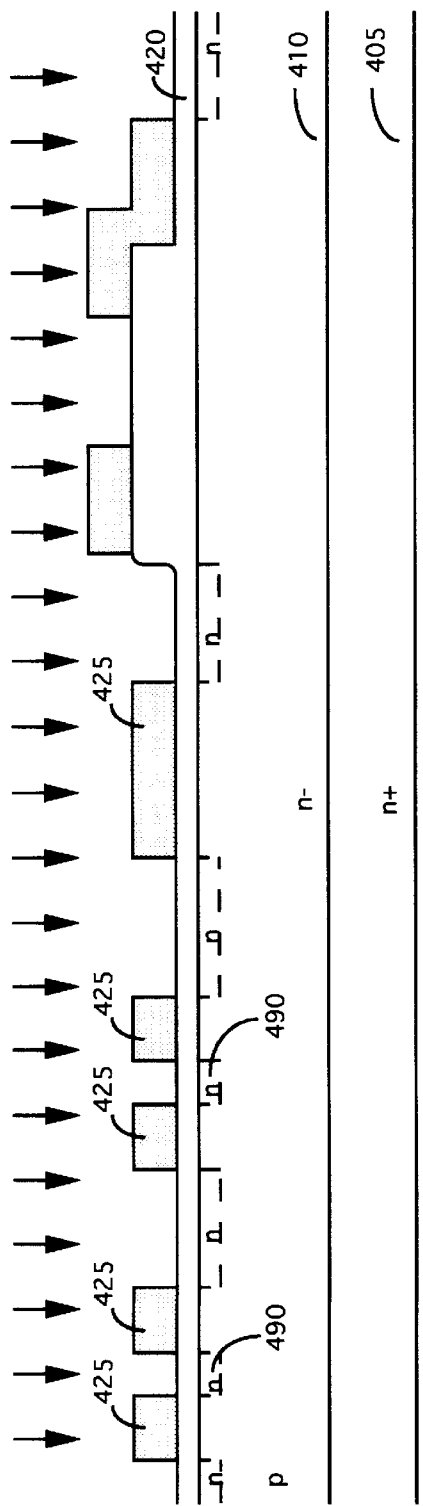
FIGS. 12A to 12D are cross sectional views to show the processing steps in fabricating a MOSFET device of FIG. 11.
Figure 12B:
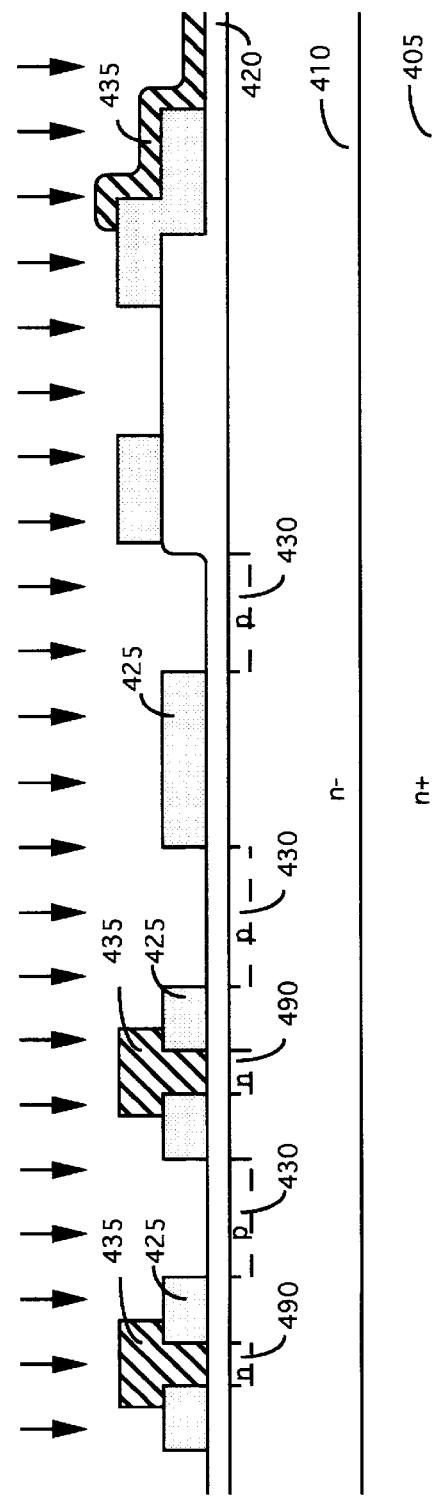

Please refer to FIGS. 12A to 12D for the processing steps in manufacturing the MOSFET device 400 as described above in FIG. 11. As shown in FIG. 12A, the processing steps begins by first growing a N-epitaxial layer 410 with a resistivity ranging from 0.1 to 1.0 ohm-cm on top of a N+ substrate 405. The substrate has a resistivity of 0.001 to 0.007 ohm-cm. The thickness and the resistivity of the epitaxial layer 410 depend on the device requirements for the on-resistance and breakdown voltage. In a preferred embodiment, the thickness of the epi-layer 410 is about six to eight microns. An initial oxide layer 415 of thickness in the range of 5,000 to 10,000 Å is grown which is then etched by applying an mask to define the active areas. A gate oxidation process is first carried out to form a gate oxide layer 420. A polysilicon layer 425 is then deposited on the gate oxide layer 420. A POCL$_3$ doping process is carried out followed by an arsenic (As) implant process with an ion beam of energy at 60–80 Kev with a flux density of 5 to $8 \times 10^{15}$/cm$^2$. A poly mask is then applied to carry out the an anisotropic etching process to define the poly gate 425 and the RFET implant areas above the JFET region 440. It is then followed by a high energy JFET implant at 150–300 Kev with an ion flux ranging from $10^{11}$ to $10^{13}$/cm$^2$. Referring to FIG. 12B, a p-body implant at 30–100 Kev with an ion beam of $3 \times 10^{13}$ to $3 \times 10^{14}$/cm$^2$ flux density is applied to implant the p-body regions 430. The resist is then stripped and a p-body diffusion process is then carried out at an elevated temperature of 1,000°–1,200° C. for ten minutes to three hours to increase the depth of the p-body region 430 to 1.0–2.0 $\mu$.

Figure 12C:
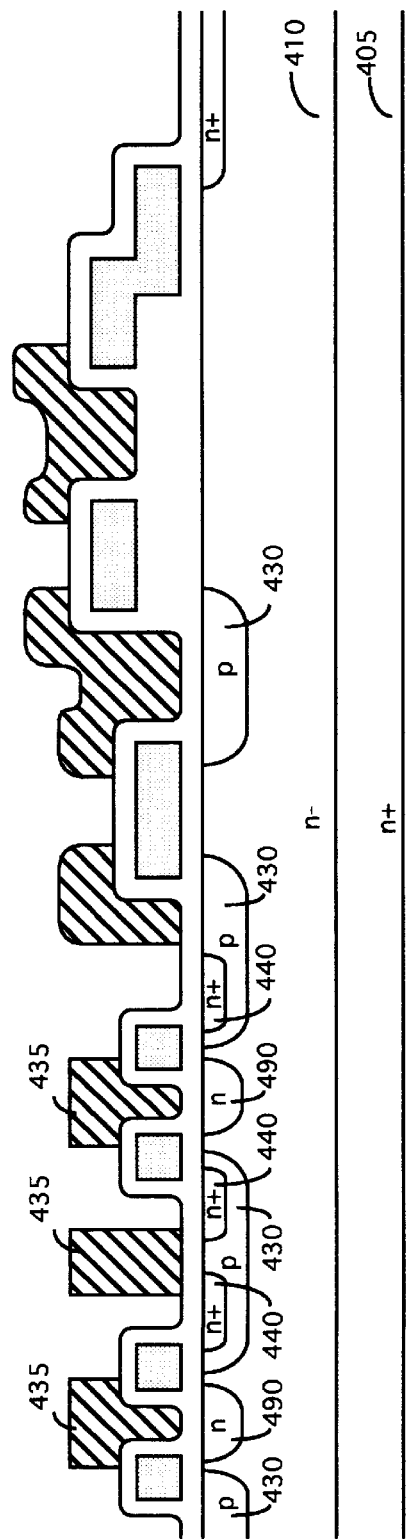
Figure 12D:
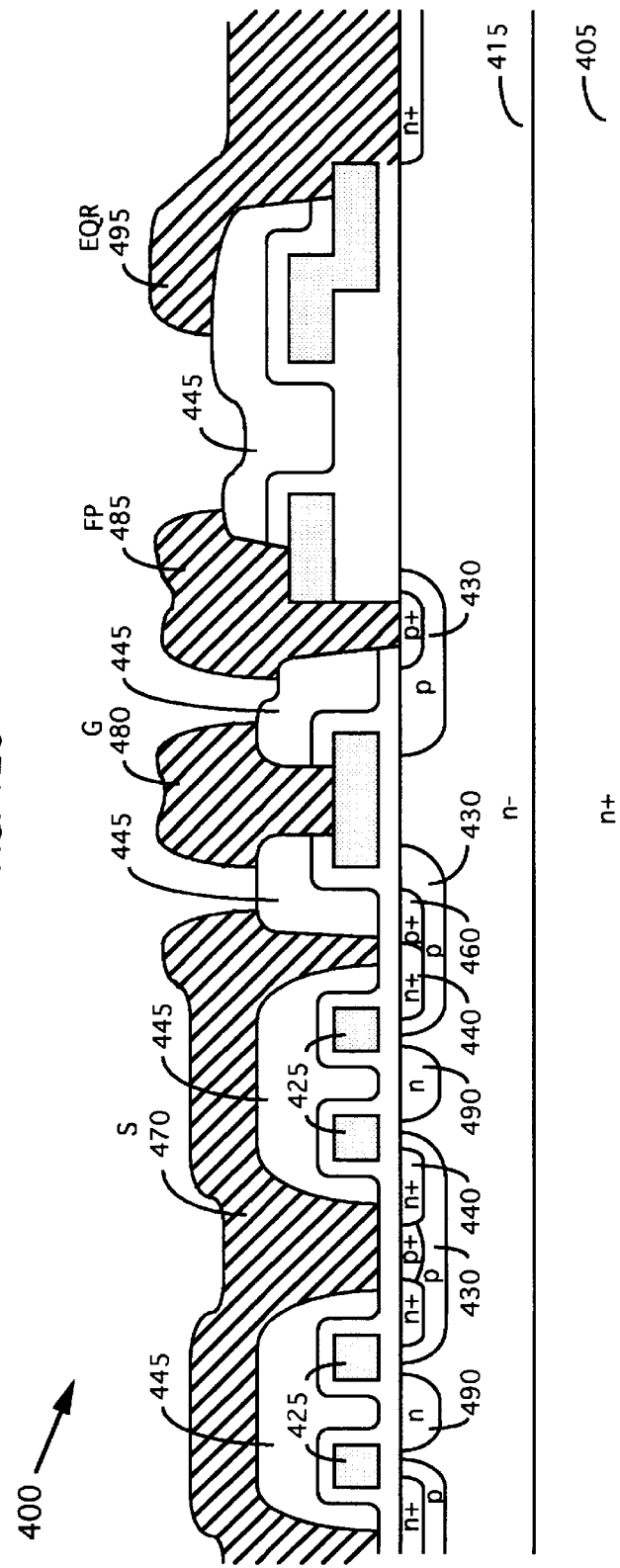

Referring to FIG. 12C, a N+ block mask 435 is applied to carry out an N+ implant to form the N+ region 440. The N+ implantation is carried out with an ion beam at an energy of 60–100 Kev and ion flux density of $5\times10^{15}$ to $1\times10^{16}/cm^2$. After the resist, i.e., the N+ blocking mask 430, is stripped, the N+ source regions 440 are driven into desired junction depth ranging from 0.2 to 1.0 $\mu$ by a diffusion process. Referring to FIG. 12D, a BPSG or PSG is deposited to form a layer 445 of approximately 5000–15,000 Å in thickness. A BPSG flow or PSG densification process is performed at 900°–950° C. for thirty minutes to one hour. A contact mask is applied to perform an etching process to define the contact windows. A p+ ion implantation is carried out to form the p+ region 450 by a p+ activation process at 900°–950° C. in an oxidation or inert gas ambient. The final power MOSFET device 400 is completed with the metal deposition and metal etching with a metal mask to define the source contacts (S) 460, the gate contacts (G) 470, the field plate (FP) 480, and equal potential ring (EQR) 485.

Figure 13:
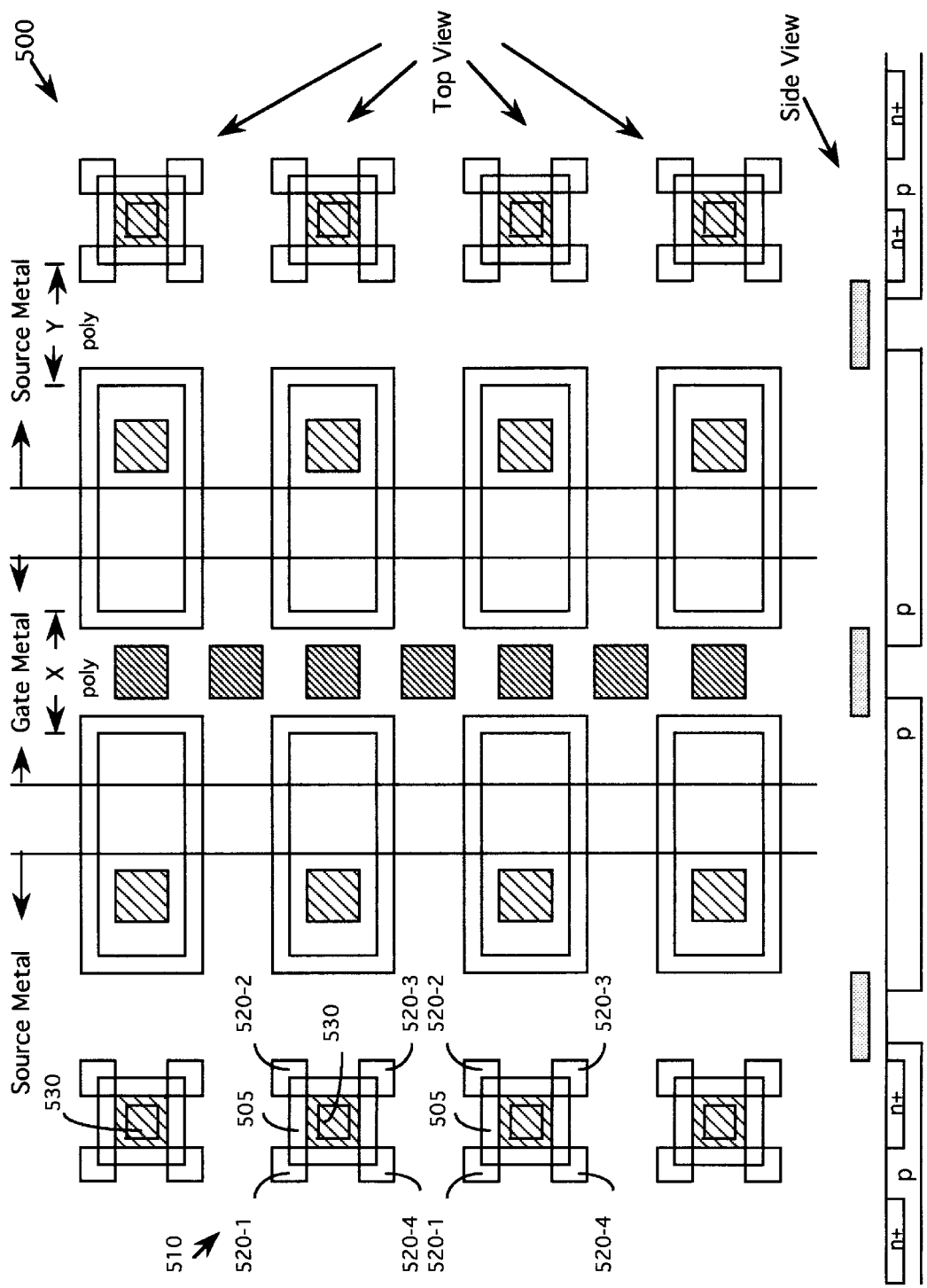
FIG. 13 shows a top view of a MOSFET device with equivalent critical dimension design and corner breakdown prevention blocking for n⁺ implant of the present invention.

Please refer to FIG. 13 for a further improvement in fabricating a power MOSFET device 500. As shown in the cell topology, the critical dimensions (CD), i.e., the dimension of the poly gate and the core cell, are maintained to be equivalent, i.e., X=Y. Such arrangement provides a special advantage that early breakdown at poly gate runners is prevented because the symmetrical geometry providing a field sharing effect which reduces the likelihood of breakdown. This design feature was not available earlier due to the difficulties in precisely controlling the photolithography operations. It was necessary to make a broader poly gate due to this lithographic imprecision. This invention takes advantage of advancement made in photolithography technology to improve the breakdown voltage at the poly gate runners by making the critical dimension of the poly gate the same as that of the core cell.

Referring to FIG. 13 again for another improvement in power MOSFET fabrication process where a N+ blocking photo resist 510 is applied at the four corners, i.e., 520-1, 520-2, 520-3, 520-4, and 530 above the core cell 505. It is well known in the art that punch through and early breakdown problems often occur at corners due to a 'spherical diffusion' pattern which is different than that of other regions. For that reason, the present invention provides a novel N+ corner blocking photo resist 510 to block out four corners 520-1 to 520-4 to eliminate the problems which often occur at comers thus greatly improve the manufacturing capability of the power MOSFET devices.

In summary, this invention disclosed a MOSFET device 100 which includes a plurality of vertical cells 102 each includes a source 140, a drain 105, and a channel for conducting source-to-drain current therethrough. Each of the vertical cells 102 is surrounded by a poly layer 125 acting as a gate for controlling the source-to-drain current through the channel. The MOSFET device 100 further includes a plurality of open stripes 104 opened by removing a stripes of the poly layer 125 connecting two adjacent vertical cells 102 whereby a width of the channel for conducting the source-to-drain current is increased and a junction field-effect-transistor (JFET) resistance for each of the vertical cells is decreased. In another preferred embodiment, the MOSFET device 400 further includes a plurality of gate-doping-opening 480 which is opened in the gate by removing a portion of the poly layer 420 near a mid-section between the vertical cell whereby a portion 490 of the drain region 410 underneath the gate-doping-opening 480 is selectively doped for further reducing the JFET resistance. In yet another preferred embodiment, the open stripes are opened between only a some of the adjacent vertical cells whereby a switching speed of the MOSFET device is improved while maintaining a reduced junction field-effect-transistor (JFET) resistance. In yet another preferred embodiment, i.e., MOSFET 500, each of the vertical cells being substantially a square shape of a side-length X, and a distance between each of the cells being approximately Y, wherein the X is about same as the Y whereby an early breakdown at a gate runner of the MOSFET device can be prevented. In yet another preferred embodiment, i.e., MOSFET 500, each of the vertical cells further includes four corner blocking zones 520-1 to 520-4 wherein each of the four comer blocking zones being formed with a four-corner source-blocking-photoresist for reducing a punch-through and an early-breakdown in each of the four corners of the vertical cells.

Therefore, the present invention provides an improved MOSFET structure, topology, and fabrication process to overcome the difficulties encountered in the prior art. Specifically, an improved MOSFET structure and fabrication process are disclosed wherein novel cell topology is arranged to increase the channel width thus maintain a reasonable low on-resistance even when the cell density is increased beyond the current limit 6.5 million cells/inch$^2$ and the dimension of the MOSFET cell is further reduced. Furthermore, an improved MOSFET structure and fabrication process are provided where the poly gate above the drain region is patterned and selectively implanted with the same type of dopant as the drain region to reduce the on-resistance and the JFET effect. Additionally, the critical dimensions of the MOSFET cells are made equivalent by taking advantage of modern technology of more precisely controllable lithographic processes without requiring to make a broader poly gate such that the breakdown voltage at the poly gate runner can be prevented. Finally, a corner blocking technique is applied for applying a N+ photo resist at the four corners of each core cell for improving the manufacturing capability of a power MOSFET device by preventing a spherical diffusion problem frequently occurred at four corners of these MOSFET cells.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A MOSFET device includes a plurality of vertical cells each includes a source, a drain, and a channel for conducting source-to-drain current therethrough wherein each of said vertical cells being surrounded by a poly layer acting as a gate for controlling said source-to-drain current through said channel wherein:

said poly layer functioning as gates extending from each of said vertical cells to adjacent cells thus defining a first critical dimension constituting substantially a distance between said vertical cells;

said poly layer further extends to a gate contact area and forming a gate runner therein; a plurality of gate contact windows above said gate runner; a second critical dimension constituting a width of said gate runner compatible with a width of said gate contact windows; and said first critical dimension is substantially the same as said second critical dimension.

* * * * *